United States Patent
Tixhon et al.

(10) Patent No.: US 9,005,718 B2
(45) Date of Patent: Apr. 14, 2015

(54) PROCESS FOR DEPOSITING FILMS SIMULTANEOUSLY ONTO BOTH SIDES OF A SUBSTRATE

(75) Inventors: Eric Tixhon, Crisnee (BE); Joseph Leclercq, Evere (BE); Eric Michel, Uckange (FR)

(73) Assignee: AGC Glass Europe, Brussels (BE)

( * ) Notice: Subject to any disclaimer, the term of this patent is extended or adjusted under 35 U.S.C. 154(b) by 1109 days.

(21) Appl. No.: 13/054,090

(22) PCT Filed: Jul. 16, 2009

(86) PCT No.: PCT/EP2009/059157
§ 371 (c)(1),
(2), (4) Date: Apr. 7, 2011

(87) PCT Pub. No.: WO2010/007134
PCT Pub. Date: Jan. 21, 2010

(65) Prior Publication Data
US 2011/0200763 A1   Aug. 18, 2011

(30) Foreign Application Priority Data
Jul. 16, 2008  (EP) .................................. 08160508

(51) Int. Cl.
| C23C 16/455 | (2006.01) |
|---|---|
| C23C 16/458 | (2006.01) |
| C23C 16/50 | (2006.01) |
| C23C 16/52 | (2006.01) |
| C23C 16/509 | (2006.01) |
| C03C 17/00 | (2006.01) |
| C23C 16/54 | (2006.01) |

(52) U.S. Cl.
CPC ............ C23C 16/509 (2013.01); C03C 17/002 (2013.01); C03C 2218/365 (2013.01); C23C 16/54 (2013.01)

(58) Field of Classification Search
CPC .... C23C 16/455; C23C 16/458; C23C 16/50; C23C 16/52
USPC ................................ 427/533, 535, 569, 576
See application file for complete search history.

(56) References Cited

U.S. PATENT DOCUMENTS

| 4,790,921 | A | * | 12/1988 | Bloomquist et al. ...... 204/192.12 |
|---|---|---|---|---|
| 5,211,759 | A | * | 5/1993 | Zimmermann et al. .. 118/723 R |
| 5,234,561 | A | * | 8/1993 | Randhawa et al. ...... 204/192.38 |
| 5,789,040 | A | * | 8/1998 | Martinu et al. ................ 427/575 |
| 7,902,047 | B2 | * | 3/2011 | Kulkarni et al. .............. 438/478 |
| 8,470,095 | B2 | * | 6/2013 | Tixhon et al. ................... 134/1.1 |
| 2002/0054468 | A1 | * | 5/2002 | Chiavarotti et al. .......... 361/302 |
| 2007/0126505 | A1 | * | 6/2007 | Bockelman et al. .......... 330/252 |
| 2007/0186856 | A1 | * | 8/2007 | Yasui et al. ............... 118/723 E |
| 2008/0118734 | A1 | * | 5/2008 | Goodwin et al. ............. 428/221 |
| 2008/0246101 | A1 | * | 10/2008 | Li et al. ......................... 257/412 |

FOREIGN PATENT DOCUMENTS

| JP | 61-204374 | * | 9/1986 |
|---|---|---|---|
| JP | 2006 316299 | | 11/2006 |
| JP | 2007 273915 | | 10/2007 |
| WO | 2007 089146 | | 8/2007 |

OTHER PUBLICATIONS

Kokaku, Y., et al., "Plasma Enhanced CVD Method for Simultaneous Deposition on Both sides of the Substrate and Its Application to the In-line Multilayer Deposition System." 1993 Japan International Electronics Manufacturing Technology, pp. 18-21.*
Szeghalmi, Adrianna, et al., Atomic layer deposition of Al2O3 and TiO2 multilayers for applications as bandpass filters and antireflection coatings. Applied Optics, vol. 48, No. 9, Mar. 20, 2009, pp. 1727-1732.*
Vostokov, N.V., et al., "Deposition of YBCO films on both sides of substrate by magnetron sputtering". Technical Physics Letters, 2010, vol. 36, No. 9, pp. 859-861.*
Gen, Masao, et al., "Simultaneous Deposition of Submicron Aerosols onto Both Surfaces of a Plate Substrate by Electrostatic Forces." e-Journal of Surface Science and Nanotechnology, vol. 12, (2014) pp. 238-241.*
International Search Report issued Oct. 2, 2009 in PCT/EP09/059157 filed Jul. 16, 2009.
U.S. Appl. No. 13/054,311, filed Jan. 14, 2011, Tixhon, et al.
U.S. Appl. No. 13/054,284, filed Jan. 14, 2011, Tixhon, et al.
U.S. Appl. No. 14/264,094, filed Apr. 29, 2014, Tixhon, et al.

* cited by examiner

*Primary Examiner* — Bret Chen
(74) *Attorney, Agent, or Firm* — Oblon, McClelland, Maier & Neustadt, L.L.P.

(57) ABSTRACT

A process for the simultaneous deposition of films onto both sides of a substrate (2), which comprises in particular introducing a substrate (2) into a reaction chamber (106, 206) or making said substrate run therethrough, in which chamber at least two electrodes (110, 210) are placed. At least one dielectric barrier (14, 114) is placed between these at least two electrodes (110, 210). An adjustable inductor (L) is placed in the secondary circuit of the transformer in parallel with the circuit comprising the at least two electrodes. A high-frequency electrical voltage is generated, said voltage being such that it generates a filamentary plasma (112, 212) on each side of the substrate between the at least two electrodes (110, 210).

11 Claims, 6 Drawing Sheets

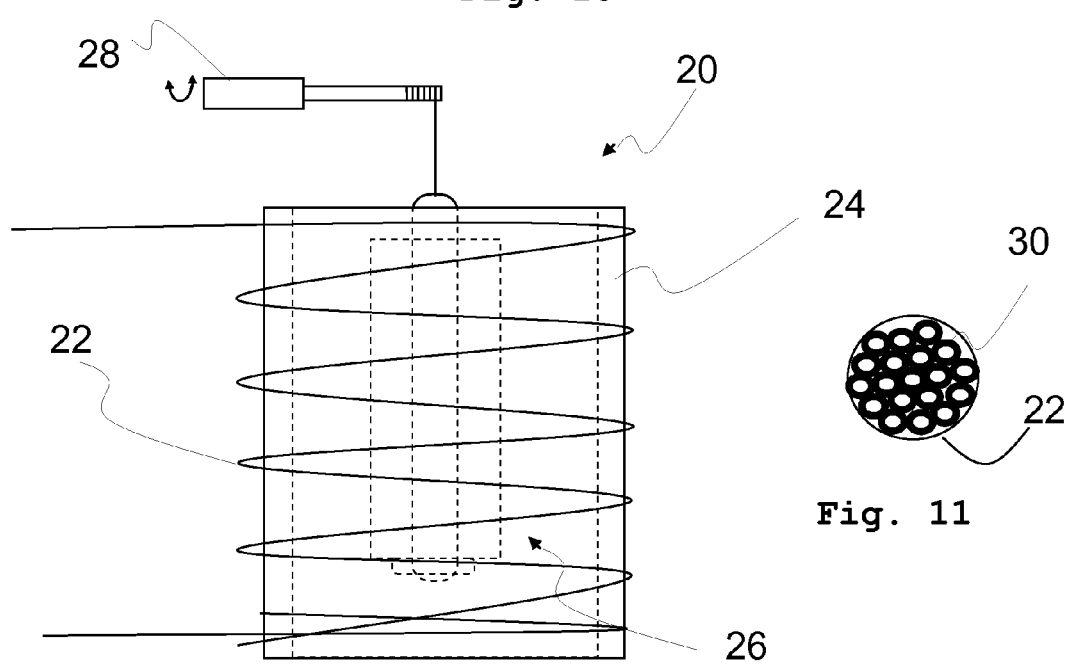

PROCESS FOR DEPOSITING FILMS SIMULTANEOUSLY ONTO BOTH SIDES OF A SUBSTRATE

FIELD OF THE INVENTION

The invention relates to a process for depositing films simultaneously onto both sides of an inorganic substrate so as to modify the properties of said substrate. In particular, the invention is aimed at simultaneously depositing films on glass plates.

The invention also relates to an installation for applying the process in question, in particular continuously.

PRIOR ART

Various processes are used to deposit thin-film coatings onto one side of various substrates. They differ in particular by the way in which the energy is generated for producing the desired compounds and/or for bonding them to the substrate.

The deposition of thin-film coatings is used in various applications, such as electronics, corrosion-resistant and tribological coatings, such as refractory films (titanium or aluminium nitrides, carbides and oxides), coatings having optical (anti-reflection, solar-protection, filter, etc.) properties, coatings providing other particular (antimicrobial, self-cleaning, hydrophilic, hydrophobic, etc.) surface properties, and conductive tin oxide films for various applications (photovoltaics, LEDs, OLEDs, organic photovoltaics, etc.).

The substrates in question may be of various types: glass, steel, ceramic, organic polymers, thermoplastics, etc.

Four thin-film deposition techniques applicable in particular in the glass field may be mainly distinguished: sol-gel; magnetron sputtering; pyrolytic spraying; and CVD (chemical vapour deposition).

CVD consists in sending chemical reactants or precursors vaporized beforehand, onto a hot substrate, which reactants and precursors decompose by pyrolysis upon contact with the hot substrate.

This process is widely applied on-line during the production of float glass.

Thus, thin films (the thicknesses of the order of a few tens or hundreds of nm), especially oxides, are obtained. The films obtained are dense and of high purity. In general, they are very stable both chemically and mechanically. The deposition rates are high.

However, the range of materials that can be deposited is limited as it is difficult to find precursors that can be volatilized and will pyrolyze within the temperature range (500-750° C.) available to glass producers.

One possible way of circumventing the substrate temperature and therefore of extending the range of precursors that can be used in CVD, and consequently the range of materials that can be deposited, is to combine conventional CVD (optionally at a lower temperature) with a plasma device.

PECVD (plasma-enhanced chemical vapour deposition) may be applied using any plasma: cold plasmas (not in equilibrium) or thermal plasmas (in equilibrium).

Cold plasmas are generally preferred. The active species (electrons, ions, metastables, etc.) of the plasma typically possess energies of a few eV and may thus cause dissociation or activation of chemical precursors.

To maintain the non-equilibrium plasma, it is often necessary to work at reduced pressure. Most known PECVD techniques therefore use low-pressure plasmas.

However, to apply this process for industrial purposes, it is necessary to minimize the costs. There is therefore a growing interest on the part of industrial manufacturers to transfer low-pressure plasma technologies to plasma technologies operating within a pressure range close to atmospheric pressure.

Various plasma types are known in plasma technologies: <<Glow dischage plasma>> or homogeneous plasma allows deposition of very homogeneous thin-film coatings and requires a relatively low energy level. However, it is lengthy and must be limited within a restricted frequency field to remain stable. It also allows a more restricted variety of thin-film species.

Raising the energy level of plasma may cause the outbreak of electric arcs. Placing a dielectric plate between the electrodes allows obtaining an intermediate state between glow discharge and electric arcs, named "filamentary" state. Filaments are intrinsically unstable but carry a high energy level, allowing a reduction of the time of processing and thus to accelatate the speed of the substrate. On the other side, owing to their random production, a paradoxically homogeneous deposition rate of materials is obtained, a very high number (typically, $10^6$ per square centimeter per second) of microdischarges being produced during a cycle on a given area.

It has been endeavoured to marry the potentialities of conventional CVD treatment processes with the potentialities of an atmospheric-pressure plasma process. Our choice was to use a dielectric barrier discharge (DBD). This has the advantage, over the other plasma processes, of operating both at low pressure and at atmospheric pressure, and of allowing continuous treatment on large areas, which implies producing active electrical power in the order of up to one MegaWatt.

Such processes have been described for much more reduced power ranges for example in WO 2005/113856 for coating a plastic. WO 2004/013376 describes a plasma CVD process specific for the deposition of photocatalytic $TiO_2$ films. This process requires a glow discharge plasma post-treatment of the deposited coating.

In both cases cited, the processes have the major drawback of having mediocre energy efficiency: most of the power generated is dissipated as a pure loss. The problem is due in large part to the capacitive impedance of the discharge circuit, which is higher the greater the distance between the electrodes (and consequently the distance between the electrodes and a substrate placed therebetween).

WO 2007/089146 describes a device for the treatment in glow discharge mode of a heat-sensitive surface (triacetyl cellulose). The power levels involved are relatively low (300 to 800 W). This device uses a particular power supply type (pulsed generator). An impedance is employed only for the use of induction coils in parallel and in series, not to stabilize the load but to increase the degree of fragmentation of a precursor generated in the plasma discharge.

WO 99/04411 describes a film treatment apparatus, the RF power supply mode of which induces a high reflected power. There is therefore a complex secondary circuit, unlike the one developed in the present invention.

JP 2007 273915 describes a low-power (500 W) vacuum plasma treatment process provided with an RLC circuit in the secondary. The authors report better efficiency of the treatment when they compensate for being close to resonance of the circuit.

SUMMARY OF THE INVENTION

The approach considered was to place a substrate between two electrodes while still maintaining a gap on either side of the substrate in order to create two reaction zones, so as to deposit a film simultaneously onto both sides of a substrate.

A first object of the invention is to save time in depositing films, possibly of different nature, simultaneously on both sides of a substrate.

Another object of the invention is to improve the energy efficiency of an installation for depositing films on a substrate using the DBD process.

Another object is to improve the efficiency of deposition without unduly degrading the energy efficiency.

Another object of the invention is to ensure that this improvement maintains its efficiency whatever the conditions imposed by various types of manufacture, and especially for substrates of various thicknesses, for different film types, etc.

One subject of the invention is a process for simultaneous deposition onto both sides of an inorganic substrate, characterized in that it comprises the following operations:

- a substrate is introduced into or made to run through a reaction chamber in which at least two electrodes are placed, on each side of the substrate, at least one dielectric barrier being placed between at least one side of the substrate and these at least two electrodes;
- a stabilized power supply that includes an HF transformer, to the terminals of the secondary of which the at least two electrodes are connected, is employed;
- a stabilized high-frequency voltage is generated in the secondary circuit of this transformer, said voltage being such that it generates a filamentary plasma on each side of the substrate between the at least two electrodes;
- an adjustable inductor (L) placed in parallel with the intrinsic inductor of the circuit comprising the at least two electrodes is employed so as to reduce the phase shift between the voltage and the current that are generated in the secondary of the transformer;
- a mixture is introduced into the reaction chamber, on each side of the substrate, the composition of said mixture being such that, upon contact with the plasma, it decomposes and generates species capable of being deposited as a film onto the corresponding side of the substrate;
- the voltage and/or the frequency delivered by the stabilized power supply and/or the inductance of the adjustable inductor (L) placed in parallel with the circuit comprising the at least two electrodes are/is adapted at the start of or during the process, so as to obtain optimum reaction characteristics;
- the voltage and/or the frequency delivered by the generator circuit and/or the inductance of the inductor (L) are/is adapted so as to promote the production of harmonics extending the time during which the voltage remains above that for sustaining the electrical discharge and which, as a consequence, corresponds to the time during which the current flows between the electrodes; and
- the substrate is kept in the chamber for a period of time sufficient to obtain a film of desired thickness on each side of said substrate.

It should be noted that the process of the invention is defined in terms of "operations" rather than of "steps", that is to say the succession of operations is not necessarily carried out in the order in which they are indicated above.

A first advantage of the process of the invention is that the energy supplied by the filamentary plasma on each side of the substrate may be modulated, in particular by adjusting the respective distances between the electrodes and the substrate, thereby making it possible for films having a large variety of compositions to be simultaneously deposited.

According to one advantageous embodiment, the composition of the mixtures introduced into the reaction chamber on each side of the substrate is identical. By complying with the symmetry principle, the adjustments are obviously easier to perform and the problems of interference between the various reactants are reduced. This results both in a time saving and a space saving in manufacture.

According to another advantageous embodiment, the composition of the mixtures introduced into the reaction chamber on each side of the substrate is different. This makes it possible to generate species capable of being deposited as different films onto the corresponding side of the substrate. This results both in a time saving and a space saving in manufacture.

According to one advantageous embodiment, the mixtures introduced into the reaction chamber on each side of the substrate are confined in two separate zones by mechanical barriers. The substrate itself may form part of these mechanical barriers.

According to another advantageous embodiment, optionally complementary to the previous one, the mixtures introduced into the reaction chamber on each side of the substrate are combined in two separate zones by suction and/or delivery devices.

According to a preferred embodiment, the process further includes the following operations:

- an adjustable inductor (L) placed in parallel with the intrinsic inductor of the installation generating the electrical voltage is employed, so as to reduce the phase shift between the voltage and the current generated; and
- the voltage and/or the frequency delivered by the generator circuit and/or the inductance of the adjustable inductor (L) are/is adapted at the start of or during the process, so as to obtain optimum reaction characteristics.

An advantage of this embodiment is that, despite the deliberate generation of harmonics, the introduction of an inductor into the circuit improves the power factor of the installation, hence a considerable increase in its efficiency. Another advantage of this embodiment is that it also makes it possible for the process to generate sufficient active energy for obtaining high deposition rates, while still improving the properties of the films deposited.

According to a preferred embodiment, third-order and fifth-order harmonics are preferentially promoted.

One advantage of this embodiment is that, for the same consumed power, the efficiency of the process is greatly improved.

According to one advantageous embodiment, the process further includes the following operation: the atmosphere in the chamber is brought to a predetermined pressure.

Advantageously, the substrate is insulating and itself forms one of the dielectric barriers placed between the at least two electrodes.

Moreover, if the substrate is conducting, it may itself constitute one of the electrodes.

The mixture is introduced into the reaction chamber preferably in the form of a sprayed liquid, a gas or a reactive powder.

The power of the installation is preferably of at least 100 kW, or better of at least 200 kW. Preferably, the power of the installation is of at least 500 kW. In practice, a plant can reach a power of up to 1.2 MW.

Another subject of the invention is an installation for depositing a film onto a substrate, comprising a chamber, transport means and support means for introducing a substrate into the chamber or for making it run therethrough. A high-frequency high-voltage power supply is connected to at least two electrodes placed on either side of the substrate and at least one dielectric barrier is placed between the at least two electrodes. Power supply regulation/control means are provided, as are means for introducing reactive substances into the chamber and means for extracting residual gases.

According to a preferred embodiment, an adjustable inductor is placed in parallel with the power supply circuit. The characteristics of this adjustable inductor are such that it enables the phase shift between the voltage generated between the electrodes and the total current delivered by the high-voltage source to be modulated.

In this installation, the power supply regulation means and the inductor control means are advantageously coupled so as to allow generation of harmonics extending the time during which the voltage between the electrodes is maintained at a value above that for sustaining the electrical discharge.

According to one advantageous embodiment, the chamber is open at both its ends, thereby enabling the deposition process to be incorporated into a continuous production plant. For example, the chamber may be advantageously incorporated into an annealing lehr of a float glass production line, the substrate support means comprising at least one roller.

According to one advantageous embodiment, the chamber is open at both its ends and may advantageously be incorporated into a batch production line. For example, the chamber may advantageously be incorporated into a glass tempering line, the substrate support means comprising at least one roller.

According to another preferred embodiment, the chamber is closed, thereby enabling the process of the invention to be incorporated into a batch surface treatment operation. For example, the chamber may be placed in treatment lines of the magnetron sputtering type.

According to a preferred embodiment, a phase-shifting inductor is inserted in the installation of the invention. This inductor comprises a coil consisting of a bundle of conducting elements, insulated from one another, which is wound around a mandrel; a magnetic plunger core placed inside this mandrel and isolated from this mandrel, divided into several sections by inserts; a positioning device connected to the plunger core; an insulating connection connecting the plunger core to the positioning device; and a control system capable of acting on the positioning device, so as to adjust the position of the magnetic plunger core relative to the mandrel.

BRIEF DESCRIPTION OF THE DRAWINGS

Other advantages and features of the invention will become apparent from the following detailed description of particular embodiments of the invention, reference being made to the figures in which:

FIG. 10 is a schematic side view of an induction coil for an installation according to the invention; and FIG. 11 is a cross-sectional view of a strand of the winding wire used in the induction coil shown in FIG. 10.

The figures are not necessarily drawn to scale.

In general, similar elements are denoted by similar references in the figures.

DETAILED DESCRIPTION OF PARTICULAR EMBODIMENTS

Figure 1:
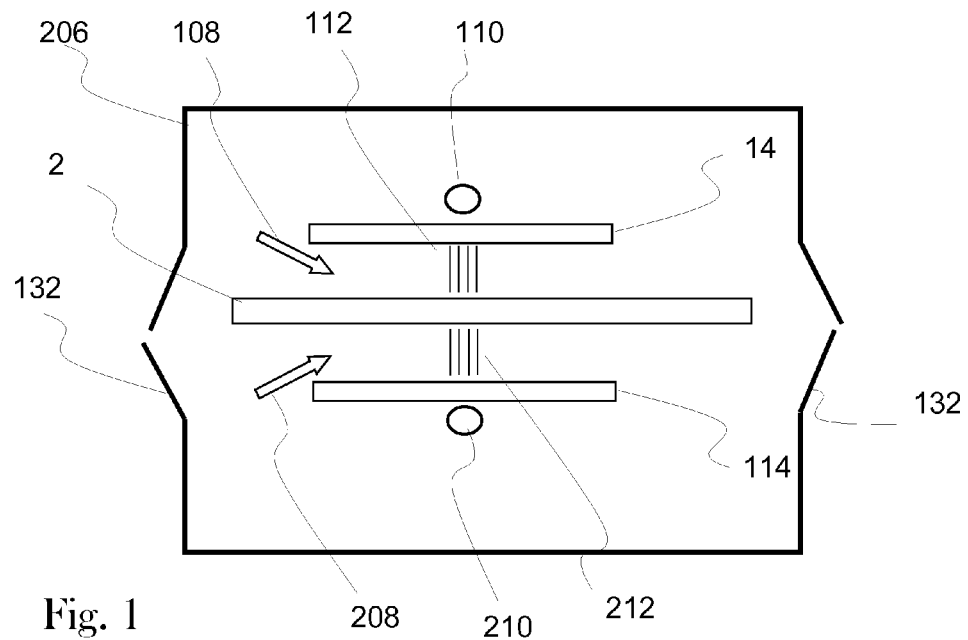
FIG. 1 is a schematic side view of a closed installation for depositing films onto a glass substrate.

FIG. 1 shows a closed chamber (206) designed for a batch process for depositing films on separate glass volumes. In this case, one or two closure devices (132) make it possible either to work at atmospheric pressure or to work at pressures well away from atmospheric pressure (typically between $10^{-1}$ Pa and 110 kPa) (in the case of the installation shown in FIG. 7, it is necessary to use powerful extraction devices so as to get away from the ambient pressure). Using the well-known CVD technique, a reactive mixture (108, 208) is introduced into the chamber (206). In the case of a process operating at reduced pressure, reactants (108, 208) may be used that have lower vapour pressures and/or have a more toxic character, without in any way endangering the health of the operators.

Unlike what happens in a conventional process, the reactive mixtures are introduced on each side of the substrate. As shown in FIG. 1, a judicious choice of the characteristics makes it possible to work simultaneously on both sides of a glass volume 2, even depositing thereonto, as the case may be, films of different type. This is because there is the possibility of using various tricks (physical separation or extractor suitably positioned) to introduce different reactive substances (108, 208) on either side of the glass volume 2 in two plasma zones (112, 212). These two plasma zones are located between the glass volume (2) and two electrodes (110, 210) placed in the chamber (6) on each side of the glass volume. Furthermore, the distance between the substrate (2) to be coated and the two electrodes (110, 210) can be modulated and adjusted according to the desired deposition criteria. The possibilities associated with generating a plasma on each side of a substrate by means of a single discharge are numerous. In fact, the number of applications for a substrate treated on both sides is ever increasing. Moreover, the fact of generating two films simultaneously within the same chamber not only saves time but also frees up floor space, which is always an advantage.

As mentioned above, to generate a plasma, two electrodes are placed in the chamber 206. These electrodes (110, 210) lie along an axis perpendicular to the direction in which the glass sheet (2) runs. Since a high voltage is applied at high frequency between these electrodes (110, 210), plasmas (112, 212) (shown schematically by a halo) are generated, from which the possibly different reactants introduced into the chamber on each side of the substrate draw the necessary energy, making it possible for a large variety of compounds to be simultaneously deposited on both sides of the glass sheet. The voltage is preferably between 1 kV and 200 kV peak to peak, more preferably between 5 kV and 100 kV peak to peak and even more preferably between 10 kV and 40 kV peak to peak. The frequency is preferably between 10 kHz and 1000 kHz, more preferably between 20 kHz and 400 kHz and even more preferably between 50 kHz and 200 kHz.

To reduce the possible risk of forming electric arcs directly between the two electrodes, a dielectric barrier (14, 114) may be placed in the chamber between the positions of the two electrodes (110, 210). To further increase the energy available for the reaction, the glass sheet 2 may be at high temperature. The thermal energy thus available is added to the energy delivered by the plasma, thus enhancing film deposition of the desired composition.

The problem that generally arises in this type of process, whenever it is desired to take it from the experimental stage to industrial production, is the low efficiency obtained with regard to the energy consumed to generate the plasma. As a consequence, this efficiency must be improved so as to make the process not only energetically profitable but also to allow the process to generate sufficient active energy to obtain high deposition rates while improving the properties of the films deposited. This is all the more so in the present case since the two gaps, which act as capacitors in series, reduce a priori the discharge current. Consequently, it is necessary to have an installation for achieving high power levels while still maintaining good efficiency.

Figure 2:
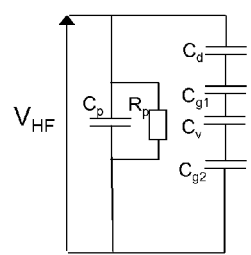
FIG. 2 is an equivalent circuit diagram for the installation of FIG. 1 before plasma formation.
Figure 3:
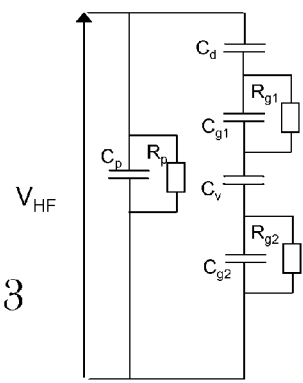
FIG. 3 is an equivalent circuit diagram for the installation of FIG. 1 after plasma generation.

A thorough study of all the factors involving energy was therefore undertaken, thereby making it possible to reduce, very schematically, the installation in question to two equivalent circuit diagrams, as shown in FIGS. 2 and 3. The equivalent circuit diagram for such an installation is obviously more complex than in a conventional installation (in which only one film can be deposited at a time).

FIG. 2 is a very simplified equivalent circuit diagram for the installation before ignition, a high voltage being applied between the electrodes (110, 210). Installing the discharge in the chamber 206 essentially amounts to adding capacitances in parallel and in series, namely $C_p$ (parasitic capacitance in parallel with a parasitic resistance $R_p$), $C_d$ (capacitance of the dielectric(s)), $C_v$ (capacitance of the glass) and $C_{g1}$ and $C_{g2}$ (capacitance of the gas).

FIG. 3 shows the same circuit diagram when the plasma is generated. At this moment, $C_{g1}$ and $C_{g2}$ are shunted by resistances $R_{g1}$ and $R_{g2}$, which represent the resistance of the two plasma zones.

In the absence of a discharge (i.e. as long as the voltage applied between the electrodes is below the ignition voltage), the values of $R_{g1}$ and $R_{g2}$ are extremely high, and the total current delivered by the source is in practice purely capacitive, the reactive part being essentially dependent on the dielectric loss in the insulator of the electrodes and of the substrate. During discharge, the "useful" currents $I_{g1}$ and $I_{g2}$ flowing through the discharges always remain low compared with capacitive components. The use of the voltage source is therefore limited, the delivered power being dissipated in producing a very high reactive current, whereas only the active component, delivering the "watted" (i.e. in-phase) power to the discharge ($P_w = R_g I_g^2$), is useful.

Figure 4:
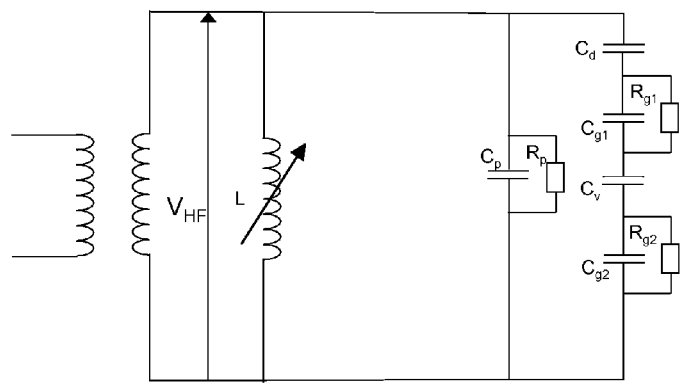
FIG. 4 is an equivalent circuit diagram for the installation according to a preferred embodiment of the invention.

To compensate for the lack of watted power, consideration was given to placing, in parallel with the installation, an induction coil L acting as "energy reservoir", making it possible to generate a current in phase opposition with the energy absorbed by the capacitive load. This allows almost complete recovery of the energy involved. An equivalent circuit diagram as shown in FIG. 4 is therefore obtained.

However, it should be pointed out that this type of compensation is not similar to the compensation obtained for example by placing an induction coil in parallel with a current distribution line. This is because what is involved here is not a fixed capacitive component, as is the case in a distribution network, but a load eminently variable according to the frequency (here, kilohertz frequency), the thickness of the substrate and the reactants introduced into the chamber (which induce variations in the electrical and dielectric properties of the gas and the plasma, etc.). As a consequence, it is necessary to employ a very particular type of induction coil, capable not only of withstanding the loading conditions generated in a high-power installation, at high voltage, of course, but also at high frequency, and also having the possibility of being adjusted relatively finely according to the imposed conditions during each type of manufacture. This is because the resultant load will vary, in particular according to the various process parameters such as, for example, the nature of the reactants, the thickness of the glass, the gas gaps, etc. The gas gaps are preferably between 0.5 mm and 100 mm, more preferably between 1 mm and 20 mm and even more preferably between 3 mm and 6 mm.

Various trials showing the possibility of employing the process of the invention in a concrete practical manner brought to light an advantageous and unexpected consequence of this process.

Figure 5:
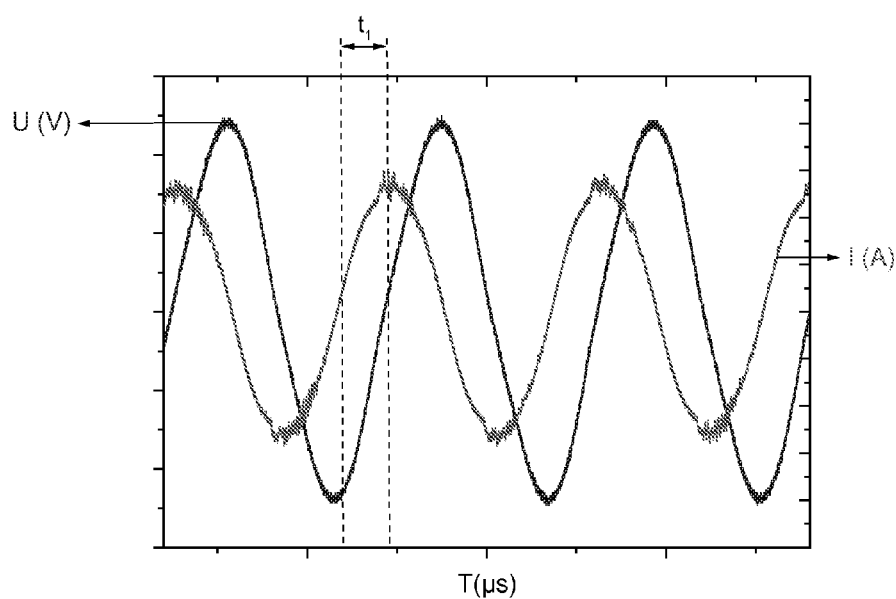
FIG. 5 is a voltage/current oscillogram in a conventional installation.

FIG. 5 shows that another phenomenon is responsible in part for the mediocre efficiency of a DBD plasma film deposition installation: when an HF high voltage is applied, for each half-period, a discharge can be sustained only over the time period $t_1$ when the applied voltage is above an ignition voltage $V_1$. This time interval is intimately linked to the parameters described above. Of course, this phenomenon is repeated each half-period. The efficiency of the process is therefore limited by the ratio of $t_1$ to the length of a half-period.

According to Fourier's law, if a source supplies a non-linear dipole, the resulting current will not be linear and will have a complex form which may be decomposed into a superposition of several curves, i.e. those having a "fundamental" frequency and a sum of harmonics.

Figure 6:
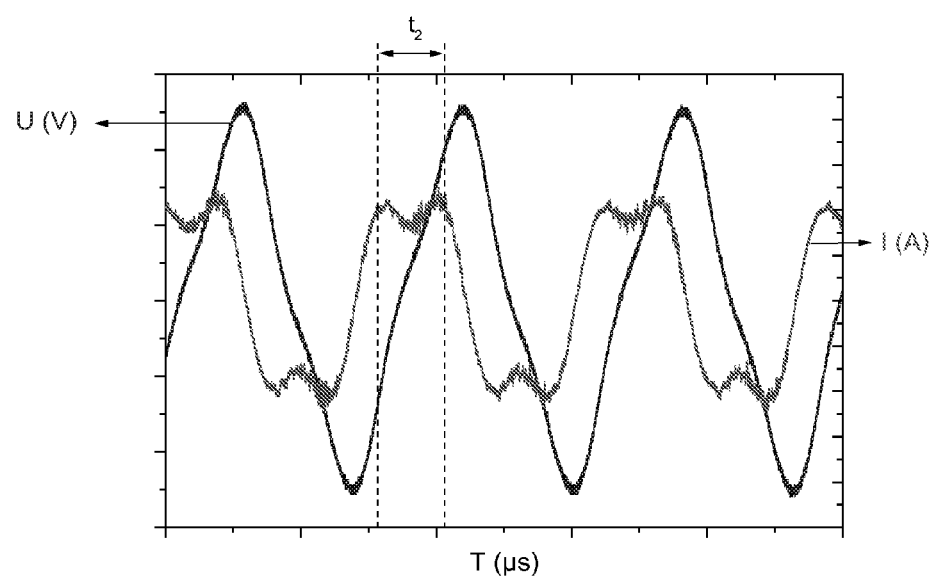
FIG. 6 is a voltage/current oscillogram obtained thanks to the process of the invention.

In the present case, it has been found that interposing an induction coil in the circuit gives rise to a distortion of the curve corresponding to the flow of current through the plasma, as shown in FIG. 6. This curve may be decomposed using the principle of Fourier series into a fundamental and a series of harmonics, the most significant ones of which, owing to their amplitude, are the $3^{rd}$ and $5^{th}$ odd harmonics. As may be seen in FIG. 6, the curve corresponding to the current flow has a kind of "plateau" over a time interval $t_2$ much longer than the interval $t_1$ observed on the curve shown in FIG. 5. The length of this interval may be optimized by varying the characteristics of the circuit, and in particular the frequency and the inductance of the inductor L. As a consequence, in the installation of the invention, by interposing an adjustable induction coil of suitable characteristics, it is possible to obtain, all other things being equal, not only an increase in active power but also a longer discharge time and, as a consequence, a much better energy efficiency.

Figure 7:
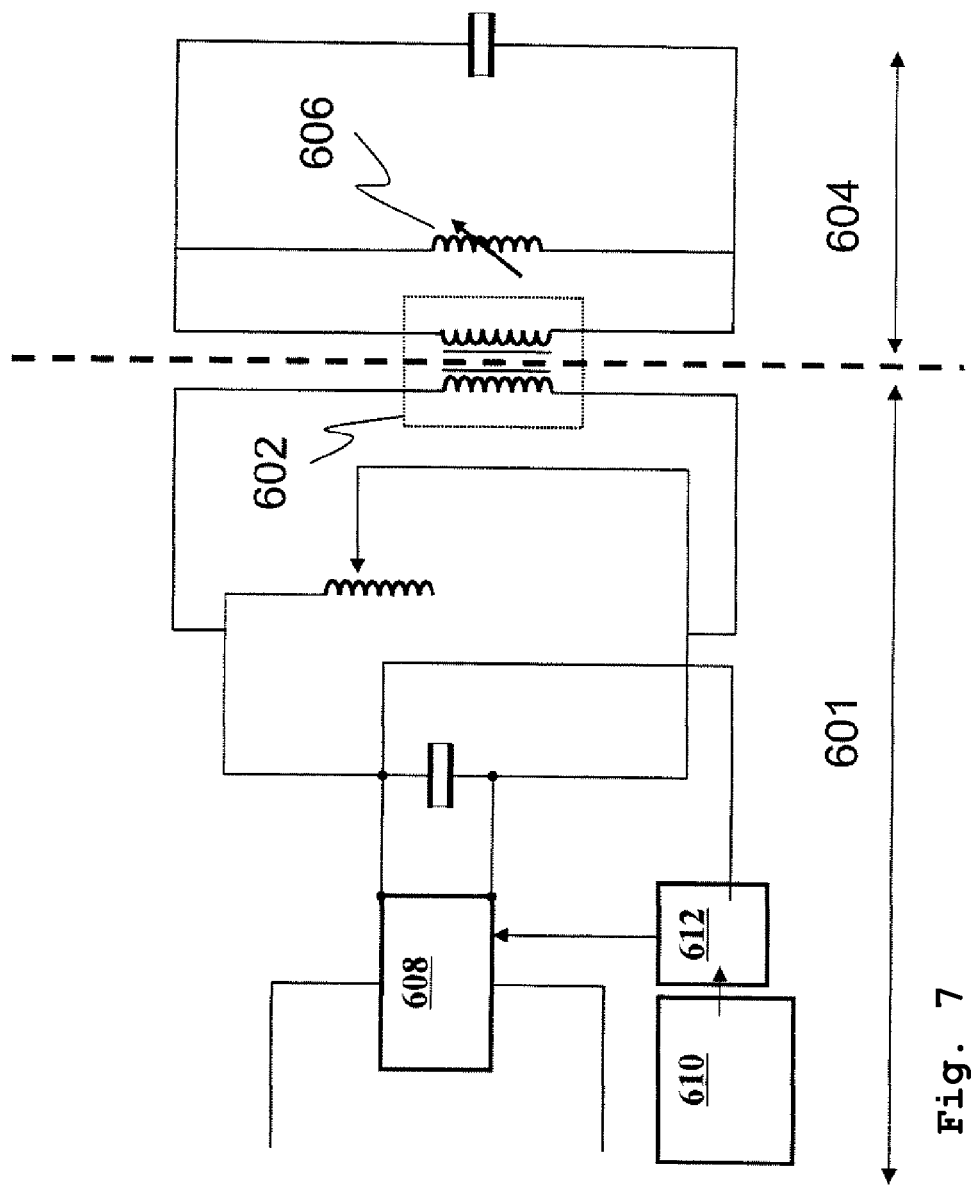
FIG. 7 is a more detailed equivalent circuit diagram of the power supply system for the installation of the invention.

FIG. 7 is a more complete equivalent circuit diagram than that sketched in FIG. 4, and better demonstrates the particular features of the installation itself, if it is compared with the prior art. Referring to this circuit diagram, it may be seen that all the adjustments (filtering, compensation, etc.) making it possible to have a stabilized and optimally compensated voltage/current curve (cos φ) are essentially performed on the primary 601 of the supply transformer 602. As a consequence, the sole adjustment means necessary for achieving the phase shift shown in FIG. 6 in the secondary circuit 604 of this transformer 602 is the variable induction coil 606, designed especially to work at very high voltage and placed in parallel with the plasma generator.

The power supply is therefore controlled in the following manner: an aperiodic generator is used consisting of an inverter 608 (which converts the DC supply current to an AC current), a parallel oscillating circuit and a variable induction coil LV1 for adjusting the operating frequency and providing the correct active power. Placed in the primary circuit of the very high-power transformer there is a power controller 610 and its associated safety circuits (P/S) 612.

Thanks to the circuit diagram shown in FIG. 6*a*, it is very simple thereafter to adjust the inductance of the induction coil LV2 in such a way that the load formed by LV2, $C_r$ and $C_p$ remains non-linear so as to promote the third-order and fifth-order harmonics that enable the stable plasma to be sustained for an appreciably longer time per half-period (see FIGS. 5 and 6).

The operations performed on the primary 601 and on the secondary 604, respectively, of the transformer therefore work in apparent contradiction: the aim is firstly (in the primary) to increase cos φ of the installation (thereby increasing its apparent efficiency) and, moreover, in the secondary, this optimum value is degraded so as to generate harmonics, which thus paradoxically increase the efficiency of plasma deposition.

If it is added that the very high-power induction coil inserted into the secondary circuit is raised to a very high voltage, the installation thus designed comprises a series of features that are paradoxical to those skilled in the art.

The active power is increased preferably by at least 10%, more preferably by at least 25% and even more preferably by at least 50%. The discharge time is increased preferably by at least 15%, more preferably by at least 30% and even more preferably by at least 60%. It should also be noted that, to determine the "optimum" inductance of the induction coil, it is necessary to take into account the intrinsic inductance of the power supply circuit (which includes a transformer), said intrinsic inductance not necessarily being neglible. Since the power supply circuit has its own resonant frequency, the inductance of L may, under certain conditions, be greatly reduced.

Among the advantages of the process as described, mention may be made of the following:
- as already pointed out earlier, practically all the adjustments and the associated circuits are connected upstream of the VHV transformer, thereby reducing the risks for operators and for the components used;
- owing to the increase in deposition efficiency, it is possible to reduce the amount of chemical reactants used. As a consequence, apart from a reduction in production costs and in environmental impact, it is observed that there is less fouling of the installation, thereby generating additional cost savings;
- an increase in deposition rate, with the corollary that the treatment time is reduced. As a consequence, it is possible for substrates moving at higher speed to be continuously treated. Conversely, the width of the treatment chamber may be reduced, hence a not insignificant space saving. Finally, there is the possibility of obtaining much thicker films in a single pass, which may prove to be advantageous in particular from the standpoint of the properties of these films;
- better decomposition of the precursors is observed during the reactions taking place within the plasma. As a consequence, the presence of organic residues in the films is avoided. Furthermore, the films deposited will be more dense and better crystallized, hence an improvement in both optical and mechanical properties of the films deposited; and
- it is also possible to increase the variety of species deposited onto the substrate in film form, again with a lesser environmental impact.

Figure 8:
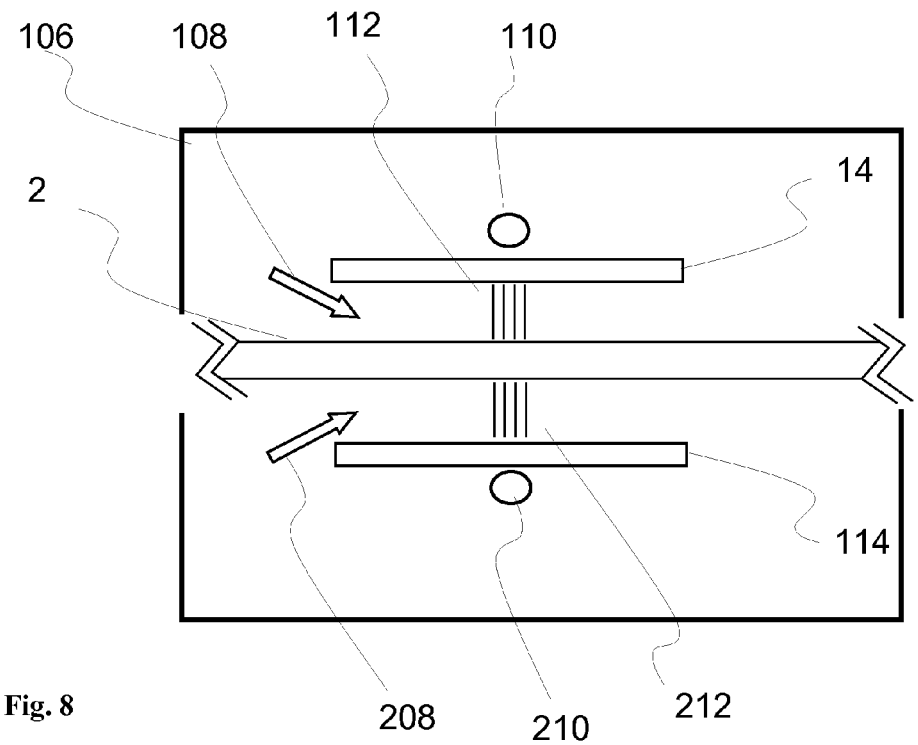
FIG. 8 is a schematic side view of one embodiment of an installation open at both its ends for film deposition onto a glass substrate according to the invention.

It goes without saying that what has been described above for an installation used for batch substrates, such as precut volumes of glass (the installation may for example be incorporated into a line for film deposition by magnetron sputtering) applies mutatis mutandis to an installation incorporated into a continuous glass line using the "float glass" process, as shown in FIG. 8. The installation is then placed in the annealing Lehr, in which case the temperature of the substrate can be varied between 20° C. and 600° C. Since the chamber 106 is then of the open type, it is necessary also to have powerful extraction means which remove the pyrolysis residues and the dust generated by the deposition process. It should be noted that the installation as shown in FIG. 7 may also be incorporated into an industrial glass tempering line.

Figure 9:
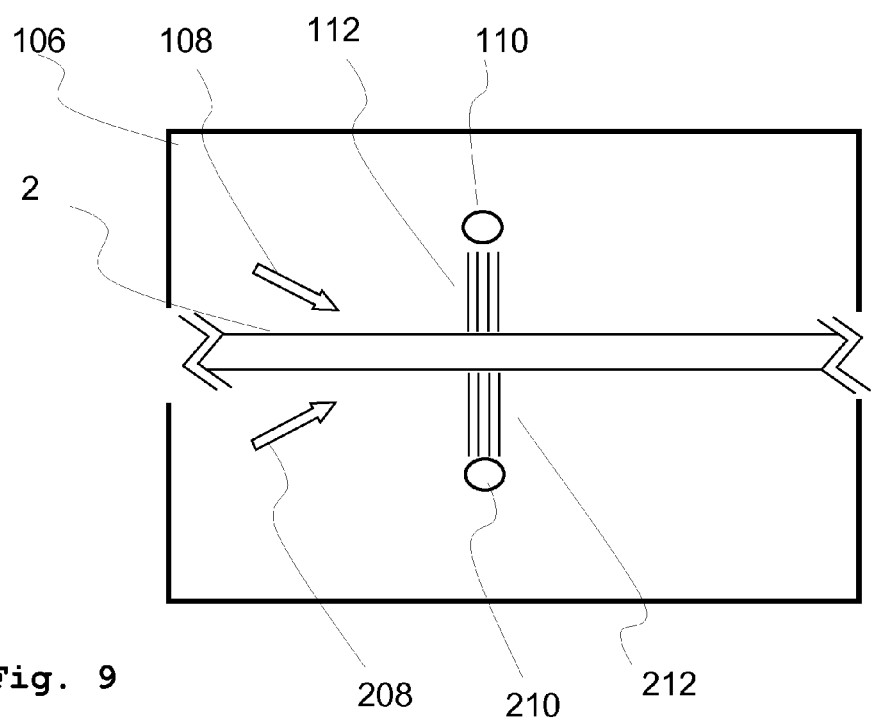
FIG. 9 is a schematic side view of an embodiment of an installation in the case of an insulating substrate, it being possible, under the conditions prevailing in the deposition chamber, for the substrate itself to form a dielectric barrier, thereby giving the possibility of not using an additional dielectric barrier.

FIG. 9 is a variant of the installation shown in FIG. 8. If the substrate is insulating, it is possible to dispense with additional dielectrics (14, 114).

FIG. 10 is a simplified representation of one embodiment of the compensating induction coil 20 for the installation of the invention. This induction coil 20 is essentially made up of a winding 22 wound around a mandrel 24. Since the voltage across its terminals may be 60 kV, the choice of material used for the mandrel supporting the winding is very important. Advantageously, Acculon was used. A plunger core 26, carefully insulated and mechanically connected to a positioning device 28 controlled by a control system, is placed inside this mandrel 24. In view of the particular operating conditions that this induction coil must face in use, a series of innovations in its practical construction has been adopted. Thus, the winding 22 is made with a bundle of copper wires 30 (see FIG. 11), which are insulated so as to increase the flow cross section for the HF current (taking into account the skin effect) and also to reduce heating. Thus, it is possible to divide the total HF current by a factor of 50 by producing a conductor bundle consisting of 50 mutually insulated strands. The winding pitch is fixed so that the risk of inter-turn arcing is as low as possible. A winding made of a single ply is therefore preferable, although it has the consequence that the device in its entirety is large. The position of the magnetic core 26, and therefore the inductance of the induction coil 20, is adjusted by remote control so that this operation can be carried out without danger to the operator.

It should be obvious to a person skilled in the art that the present invention is not limited to the exemplary embodiments illustrated and described above.

It goes without saying that it is also possible to use, in the primary circuit, a capacitive voltage tripler ($C_1$, $C_2$, $C_3$) so as to obtain a VHV while reducing the number of turns of the transformer 602, the size of which is thus appreciably reduced.

The invention comprises each of the novel features and also combinations thereof. The presence of reference numbers cannot be considered to be limiting. The use of the term "comprises" or the term "includes" can in no way exclude the presence of other elements, other than those mentioned. The use of the indefinite article "a" or "an" to introduce an element does not exclude the presence of a plurality of these elements. The present invention has been described in relation to specific embodiments, which are purely illustrative and must not be considered to be limiting.

The invention claimed is:
1. A process for simultaneous deposition onto both sides of a substrate, the process comprising:

(A) introducing the substrate comprising two sides into, or making the substrate run through a reaction chamber comprising two ends and filled with an atmosphere, in which at least two electrodes are placed, the substrate being introduced between the at least two electrodes, at least one dielectric barrier being placed between the at least two electrodes;

(B) supplying a power supply that includes an HF transformer comprising a primary and a secondary circuit, the at least two electrodes being connected to terminals of the secondary circuit;

(C) generating a voltage in the secondary circuit of the transformer, a frequency of the voltage being in a range from 10 kHz to 1000 kHz, said voltage being such that it generates a filamentary plasma on each side of the substrate between the at least two electrodes;

(D) providing an adjustable inductor placed in parallel with an intrinsic inductor of the secondary circuit comprising the at least two electrodes so as to reduce a phase shift between a voltage and a current that are generated in the secondary circuit of the transformer;

(E) introducing at least one mixture into the reaction chamber, on each side of the substrate, the composition of said mixture being such that, upon contact with the plasma, the mixture decomposes and generates species capable of being deposited as a film onto the corresponding side of the substrate;

(F) adapting at least one of the voltage delivered by the power supply, the frequency delivered by the power supply, and an inductance of the adjustable inductor placed in parallel with the secondary circuit comprising the at least two electrodes at a start of or during the process;

(G) adapting at least one of the voltage delivered by the secondary circuit, the frequency delivered by the secondary circuit, and the inductance of the inductor so as to promote production of harmonics extending a time during which the current flows between the electrodes; and (H) keeping the substrate in the chamber for a period of time sufficient to obtain a film of desired thickness on each side of said substrate.

2. The process according to claim 1, wherein a composition of the at least one mixture introduced into the reaction chamber on each side of the substrate is identical.

3. The process according to claim 1, wherein the at least one mixture introduced into the reaction chamber on each side of the substrate is at least a first mixture and a second mixture, which are different, and generate species capable of being deposited as a film onto a corresponding side of the substrate.

4. The process according to claim 1, wherein the at least one mixture introduced into the reaction chamber, on each side of the substrate, is confined in two separate zones by at least one of mechanical barriers and at least one of suction and delivery devices.

5. The process according to claim 1, wherein third-order and fifth-order harmonics are essentially promoted.

6. The process according to claim 1, further comprising:
(I) varying at least one of a position and a configuration of at least one electrode.

7. The process according to claim 1, wherein the chamber is open and comprises an entry zone and an exit zone for the substrate.

8. The process according to claim 1, wherein the chamber is closed.

9. The process according to claim 1, wherein the substrate is insulating and itself constitutes at least one of the dielectric barriers.

10. The process according to claim 1, wherein the substrate is conducting and itself forms one of the electrodes.

11. The process according to claim 3, wherein the at least first and second mixture introduced into the reaction chamber, on each side of the substrate, are confined in two separate zones by at least one of mechanical barriers and at least one of suction and delivery devices.

* * * * *